United States Patent
Rendek, Jr. et al.

(10) Patent No.: US 10,342,126 B2
(45) Date of Patent: *Jul. 2, 2019

(54) ELECTRONIC DEVICE HAVING A LIQUID CRYSTAL POLYMER SOLDER MASK AND RELATED DEVICES

(71) Applicant: HARRIS CORPORATION, Melbourne, FL (US)

(72) Inventors: Louis Joseph Rendek, Jr., Melbourne, FL (US); Travis L. Kerby, Malabar, FL (US); Casey Philip Rodriguez, Indialantic, FL (US)

(73) Assignee: HARRIS CORPORATION, Melbourne, FL (US)

(*) Notice: Subject to any disclaimer, the term of this patent is extended or adjusted under 35 U.S.C. 154(b) by 0 days.

This patent is subject to a terminal disclaimer.

(21) Appl. No.: 15/673,696

(22) Filed: Aug. 10, 2017

(65) Prior Publication Data

US 2017/0339785 A1 Nov. 23, 2017

Related U.S. Application Data

(62) Division of application No. 14/324,487, filed on Jul. 7, 2014, now Pat. No. 9,763,324, which is a division
(Continued)

(51) Int. Cl.
*H05K 1/03* (2006.01)
*H05K 1/18* (2006.01)
(Continued)

(52) U.S. Cl.
CPC ........... *H05K 1/03* (2013.01); *H01L 21/4867* (2013.01); *H01L 23/49894* (2013.01);
(Continued)

(58) Field of Classification Search
CPC ........ H05K 1/03; H05K 1/111; H05K 3/3452; H05K 3/281; H05K 1/181;
(Continued)

(56) References Cited

U.S. PATENT DOCUMENTS

| 4,548,892 A | 10/1985 | Iwasaki et al. |
| 5,024,372 A * | 6/1991 | Altman ................... H01L 24/11 228/180.22 |

(Continued)

FOREIGN PATENT DOCUMENTS

| EP | 1215948 | 6/2002 |
| EP | 2237652 | 10/2010 |

(Continued)

OTHER PUBLICATIONS

Culbertson, Edwin C., "A New Laminate Material for High Performance PCBs: Liquid Crystal Polymer Copper Clad Films," IEEE, pp. 520-523, 1995. See Priority U.S. Appl. No. 14/324,487, filed Jul. 7, 2014.
(Continued)

*Primary Examiner* — Ishwarbhai B Patel
(74) *Attorney, Agent, or Firm* — Allen, Dyer, Doppelt + Gilchrist, P.A.

(57) ABSTRACT

A method of making an electronic device includes forming a circuit layer on a liquid crystal polymer (LCP) substrate and having at least one solder pad. The method also includes forming an LCP solder mask having at least one aperture therein alignable with the at least one solder pad. The method further includes aligning and laminating the LCP solder mask and the LCP substrate together, then positioning solder paste in the at least one aperture. At least one circuit component may then be attached to the at least one solder pad using the solder paste.

8 Claims, 4 Drawing Sheets

Related U.S. Application Data of application No. 13/007,003, filed on Jan. 14, 2011, now Pat. No. 8,844,125.

(51) Int. Cl.
| | | |
|---|---|---|
| *H05K 1/11* | (2006.01) | |
| *H05K 3/28* | (2006.01) | |
| *H05K 3/34* | (2006.01) | |
| *H01L 23/498* | (2006.01) | |
| *H01L 21/48* | (2006.01) | |
| *H01L 23/00* | (2006.01) | |

(52) U.S. Cl.
CPC ............ *H05K 1/111* (2013.01); *H05K 1/181* (2013.01); *H05K 3/281* (2013.01); *H05K 3/3452* (2013.01); *H01L 24/13* (2013.01); *H01L 24/16* (2013.01); *H01L 24/81* (2013.01); *H01L 2224/05599* (2013.01); *H01L 2224/131* (2013.01); *H01L 2224/13599* (2013.01); *H01L 2224/16111* (2013.01); *H01L 2224/16238* (2013.01); *H01L 2224/81192* (2013.01); *H01L 2224/81815* (2013.01); *H01L 2924/00013* (2013.01); *H01L 2924/014* (2013.01); *H01L 2924/12042* (2013.01); *H01L 2924/14* (2013.01); *H05K 1/032* (2013.01); *H05K 1/0313* (2013.01); *H05K 3/3436* (2013.01); *H05K 2201/0141* (2013.01); *H05K 2201/10674* (2013.01); *H05K 2203/063* (2013.01); *Y10T 29/4913* (2015.01); *Y10T 29/49117* (2015.01); *Y10T 29/49124* (2015.01); *Y10T 29/49144* (2015.01); *Y10T 29/49155* (2015.01)

(58) Field of Classification Search
CPC ... H05K 2203/063; H05K 2201/10674; H05K 2201/0141; H05K 3/3436; H05K 1/032; H01L 21/4867; H01L 23/49894; H01L 2924/12042; H01L 2224/131; H01L 2224/16111; H01L 2224/05599; H01L 2224/13599; H01L 2224/81192; H01L 2224/16238; H01L 24/81; H01L 24/16; H01L 2224/81815; H01L 24/13; Y10T 29/49124; Y10T 29/49117; Y10T 29/49144

See application file for complete search history.

(56) References Cited

U.S. PATENT DOCUMENTS

| | | | |
|---|---|---|---|
| 5,313,021 A * | 5/1994 | Sajja | H05K 3/3421 174/258 |
| 5,349,495 A * | 9/1994 | Visel | H01L 21/563 174/267 |
| 5,534,094 A | 7/1996 | Arjavalingam et al. | |
| 5,679,444 A | 10/1997 | Davis et al. | |
| 5,896,271 A | 4/1999 | Jensen et al. | |
| 6,015,520 A | 1/2000 | Appelt et al. | |
| 6,183,588 B1 | 2/2001 | Kelly et al. | |
| 6,372,992 B1 | 4/2002 | Yang | |
| 6,469,393 B2 | 10/2002 | Oya | |
| 6,764,748 B1 | 7/2004 | Farquhar et al. | |
| 6,828,670 B2 | 12/2004 | Hayama et al. | |
| 6,998,327 B2 | 2/2006 | Danielson et al. | |
| 8,076,586 B2 | 12/2011 | Tuominen et al. | |
| 8,471,154 B1 * | 6/2013 | Yoshida | H01L 23/3128 174/260 |
| 8,472,207 B2 | 6/2013 | Rendek, Jr. et al. | |
| 8,693,203 B2 | 4/2014 | Rendek, Jr. et al. | |
| 2002/0092163 A1 | 7/2002 | Fraivillig | |
| 2004/0055152 A1 | 3/2004 | Fraivillig | |
| 2004/0070959 A1 | 4/2004 | Sakai | |
| 2004/0118595 A1 | 6/2004 | Flammer et al. | |
| 2005/0112798 A1 | 5/2005 | Bjorbell | |
| 2005/0218491 A1 | 10/2005 | Sasaki et al. | |
| 2005/0252682 A1 * | 11/2005 | Shimoto | H01L 21/4857 174/260 |
| 2006/0016553 A1 | 1/2006 | Watanabe | |
| 2006/0068576 A1 | 3/2006 | Burdick, Jr. et al. | |
| 2006/0124345 A1 | 6/2006 | Asami et al. | |
| 2006/0145331 A1 | 7/2006 | Cho et al. | |
| 2006/0157832 A1 | 7/2006 | Ryu et al. | |
| 2007/0025092 A1 | 2/2007 | Lee et al. | |
| 2007/0235884 A1 | 10/2007 | Hsu | |
| 2007/0241464 A1 | 10/2007 | Pendse et al. | |
| 2008/0277150 A1 | 11/2008 | Takashima et al. | |
| 2008/0299789 A1 | 12/2008 | Usui et al. | |
| 2009/0014872 A1 | 1/2009 | Tuominen et al. | |
| 2009/0078451 A1 | 3/2009 | Niki et al. | |
| 2009/0084595 A1 | 4/2009 | Park et al. | |
| 2009/0154132 A1 | 6/2009 | Okamoto et al. | |
| 2009/0241332 A1 | 10/2009 | Lauffer et al. | |
| 2009/0246911 A1 * | 10/2009 | Watanabe | H01L 23/49816 438/108 |
| 2009/0250253 A1 | 10/2009 | Park et al. | |
| 2009/0290318 A1 | 11/2009 | Takahashi | |
| 2010/0044845 A1 | 2/2010 | Funaya et al. | |
| 2010/0066683 A1 | 3/2010 | Chang et al. | |
| 2010/0163172 A1 * | 7/2010 | Saita | B32B 38/0008 156/272.6 |
| 2010/0201003 A1 * | 8/2010 | Thompson | B81B 7/0041 257/788 |
| 2010/0208437 A1 | 8/2010 | Maeda et al. | |
| 2010/0276184 A1 | 11/2010 | Zama et al. | |
| 2012/0153493 A1 | 6/2012 | Lee et al. | |
| 2012/0182701 A1 | 7/2012 | Weatherspoon et al. | |

FOREIGN PATENT DOCUMENTS

| | | |
|---|---|---|
| JP | 2002290051 A | 10/2002 |
| JP | 2004274035 A | 9/2004 |
| JP | 2004319962 A | 11/2004 |
| JP | 2005109307 A | 4/2005 |
| JP | 2005347513 A | 12/2005 |
| WO | 2008102692 | 8/2008 |

OTHER PUBLICATIONS

Narayan, C., et al., "Thin Film Transfer Process for Low Cost MCM's", IEEE/CHMT Int'l Electronics Manufacturing Technology Symposium, pp. 373-380, 1993. See Priority U.S. Appl. No. 14/324,487, filed Jul. 7, 2014.

T. Zhang et al., "The Processing and Assembly of Liquid Crystalline Polymer Printed Circuits," 2002 Int. Symposium on Microelectronics, pp. 1-9, 2002. See Priority U.S. Appl. No. 14/324,487, filed Jul. 7, 2014.

T. Zhang, et al., "Flexible Electronics: Thin Silicon Die on Flexible Substrates", IEEE Transactions on Electronics Packaging Manufacturing, vol. 32, No. 4, pp. 291-300, 2009. See Priority U.S. Appl. No. 14/324,487, filed Jul. 7, 2014.

Coombs, "PWB Pad Design", Printed Circuits Handbook, sixth edition, p. 58.15, Oct. 2007. See Priority U.S. Appl. No. 14/324,487, filed Jul. 7, 2014.

* cited by examiner

ELECTRONIC DEVICE HAVING A LIQUID CRYSTAL POLYMER SOLDER MASK AND RELATED DEVICES

FIELD OF THE INVENTION

The present invention relates to the field of electronic device fabrication and, more particularly, to an electronic device with a liquid crystal polymer substrate and solder mask, and related methods.

BACKGROUND OF THE INVENTION

As semiconductor and integrated circuit technology has advanced, there has been a trend toward high-functionality integrated circuit components with numerous input and output pins, together with a demand for reduced chip size, weight, and power consumption. Consequently, as integrated circuits get smaller, they increasingly have smaller output pins arranged more closely together than ever before.

To match these integrated circuits, there is a demand for printed wiring boards to match these integrated circuits, and which therefore have small, closely arranged solder pads. However, the miniaturization of the spacing between pins is currently happening at a greater rate than the miniaturization of solder pads on printed circuit boards. Consequently, there is an interconnection technology gap for some modern devices.

To make such devices function, printed wiring boards may have extra routing layers to handle the pins of the integrated circuits, or utilize fan-out packaging. This results in the package size of an integrated circuit being larger than the integrated circuit itself, which may limit system miniaturization. In addition to these desires for miniaturized devices, it is also desirable in some cases to construct these devices from a flexible, and not brittle, substrate.

One material now being used as a substrate from which to construct thin and flexible printed wiring boards is liquid crystal polymer (LCP). The molecules in LCPs have rigid, rod-like shapes, and maintain a crystalline order when in a liquid phase or when heated and melted. *The Processing and Assembly of Liquid Crystalline Polymer Printed Circuits*, T. Zhang, W. Johnson, B. Farrell, and M. St. Lawrence, "The processing and assembly of liquid crystalline polymer printed circuits," 2002 *Int. Symposium on Microelectronics*, 2002. discusses the construction of a printed circuit board using LCP as a substrate. A photoresist is first applied to a copper clad laminate, exposed, and developed to define a desired circuit pattern. The actual circuit is then defined by etching the exposed copper away. Holes or vias are created in the substrate via mechanical drilling. A desmearing step is then performed to remove debris from the vias or holes, thereby preparing the LCP material for metal deposition. A metalization step is next performed, and a conventional solder mask is applied to the LCP substrate. Solder is then applied through the conventional solder mask to complete the construction of the LCP printed circuit board.

While this design does allow for the creation of thin, flexible printed circuit boards, it still suffers from the same drawbacks as described above with respect to the attachment of integrated circuits with closely spaced pins thereto. As such, additional methods of connecting integrated circuits to printed circuit boards are needed.

SUMMARY OF THE INVENTION

In view of the foregoing background, it is therefore an object of the present invention to provide a method of effectively attaching an electronic component to a substrate.

This and other objects, features, and advantages in accordance with the present invention are provided by a method of making an electronic device including forming a circuit layer on a liquid crystal polymer (LCP) substrate and comprising at least one solder pad. An LCP solder mask having at least one aperture therein alignable with the at least one solder pad may be formed. The LCP solder mask and the LCP substrate may be aligned and laminated together. positioning solder paste in the at least one aperture. At least one circuit component may be attached to the at least one solder pad using the solder paste.

This method presents numerous advantages, including but not limited to the creation of a thinner electronic device than the prior art, and the ability to effectively attach an electronic component to an array of solder pads having a finer pitch than the prior art.

The at least one solder pad may comprise a plurality thereof arranged in an array pattern, and positioning solder paste may comprise positioning the solder paste using a solder stencil, for example.

In addition, attaching the at least one circuit component may be performed by heating the solder paste. Further, laminating the LCP solder mask and the LCP substrate together may be done by applying heat and pressure to the LCP solder mask and the LCP substrate. This heat and pressure may be applied in an autoclave, for example.

The LCP solder mask may be formed by punching and/or laser milling the at least one aperture in an LCP solder mask substrate. Also, the circuit layer may be formed by selective deposition and/or selective etching. The at least one circuit component may comprise at least one integrated circuit, and the LCP solder mask may have a thickness of less than 0.0015 inches.

A device aspect is directed to an electronic device. The electronic device may include a liquid crystal polymer (LCP) substrate, and a circuit layer on the LCP substrate that comprises at least one solder pad. There may be an LCP solder mask on the LCP substrate having at least one aperture aligned with the at least one solder pad. A fused seam is between the LCP solder mask and the LCP substrate. In addition, there may be solder in the at least one aperture. At least one circuit component may be electrically coupled to the at least one solder pad via solder.

DETAILED DESCRIPTION OF THE PREFERRED EMBODIMENTS

Figure 1:
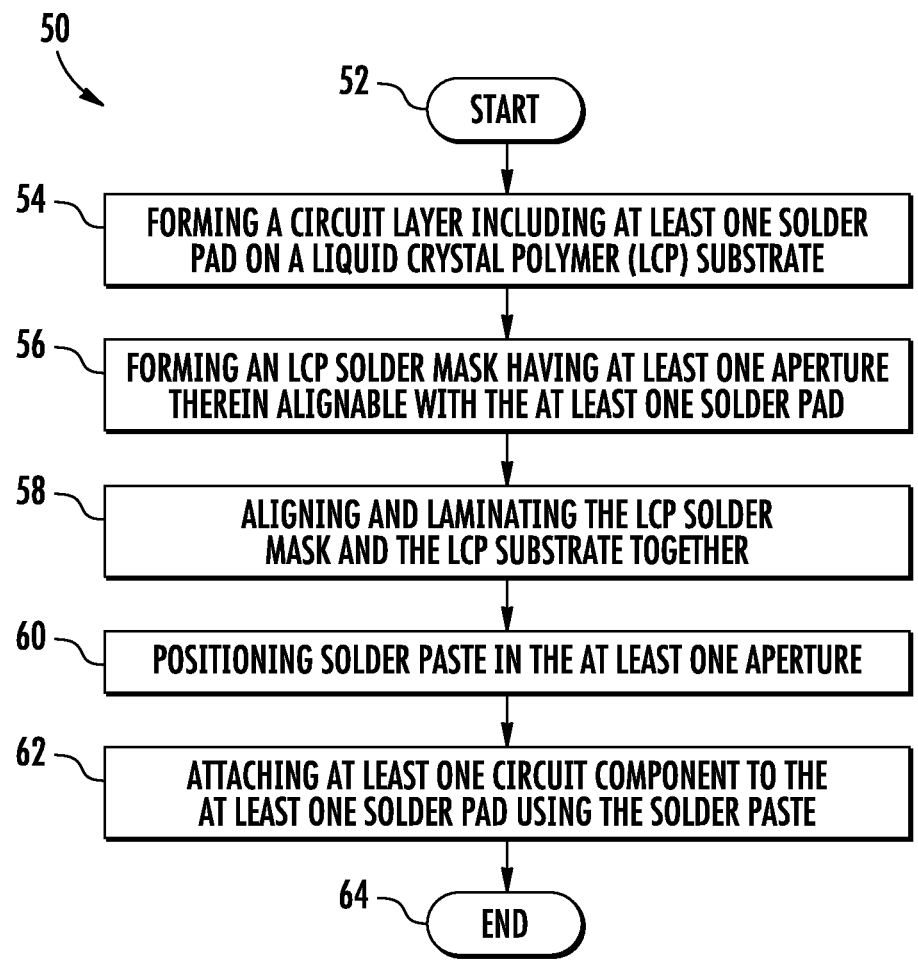
FIG. 1 is a flowchart of a method of making an electronic device according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Referring initially to the flowchart 50 of FIG. 1, and FIGS. 2A-2F, a method of making an electronic device is now described. After the start (Block 52), a circuit layer 14 including at least one solder pad 15 is formed on a liquid crystal polymer (LCP) substrate 12 (at Block 54).

LCP is a particularly advantageous material from which to form flexible printed circuit boards for a variety of reasons, including the fact that it has a high tensile strength, providing a high resistance to abrasion and damage. Typically, LCP also has a high mechanical strength at high temperatures, high chemical resistance, inherent flame retardancy, and good weatherability. In addition, LCP has a high Z-axis coefficient of thermal expansion, and is relatively inert. LCP resists stress cracking in the presence of most chemicals at elevated temperatures, including aromatic or halogenated hydrocarbons, strong acids, bases, ketones, and other aggressive industrial substances. Those skilled in the art should understand that there are a variety of LCPs that may be used in the production of electronic devices according to the present invention.

Next, an LCP solder mask 16 having at least one aperture 17 therein alignable with the at least one solder pad 15 is formed (Block 56). The apertures 17 may be as small as 0.001 inch to 0.002 inches, or smaller, for example. The LCP solder mask 16 and the LCP substrate 12 are aligned, and then laminated together (Block 58). By "alignment" it is meant that the apertures 17 contain the solder pads 15. This alignment may be performed by first using a fixture or guide to roughly align the LCP solder mask 16 and the LCP substrate 12, and then finely adjusting the alignment under a microscope to reach the final alignment. This method advantageously allows a positional accuracy of alignment in the range of 0.0005 inches to 0.001 inches.

By constructing both the substrate 12 and solder mask 16 from LCP, they may be laminated together without the use of an adhesive, reducing the total thickness of the resulting device. In addition, by constructing both the substrate 12 and solder mask 16 from LCP, these two layers may be matched (e.g. have a same dielectric constant, loss tangent, coefficient of thermal expansion, etc.), making such an arrangement particularly useful for the construction of radiofrequency (RF) devices. In addition, the use of LCP to construct the solder mask 16 results in a solder mask that is thinner than some prior art solder masks, for example 0.001 inch thick as opposed to 0.002+ inches thick. In addition, the LCP solder mask 16 exhibits a superior thickness uniformity as compared to some prior art solder masks. Further, the LCP solder mask 16 provides a better electrical isolation than conventional solder masks, having a dielectric strength of approximately 3500 volts per mil, as opposed to the 500 volts per mil of the conventional solder masks.

Solder paste 20 is then positioned in the apertures 17 (Block 60). A circuit component, such as an integrated circuit 22, is then positioned over the solder mask 16 such that the pins 23 thereof contact the solder paste 20, and attached thereto using the solder paste (Block 62). Block 64 indicates the end of the method.

A more detailed method of making an electronic device in accordance with the present is now described with reference to the flowchart 50' of FIG. 3, and also with reference to FIGS. 2A-2F. After the start (Block 52'), the circuit layer 14 is formed on the LCP substrate 12 (Block 54'). Here, the circuit layer 14 includes a plurality of solder pads 15 arranged in an array pattern. In addition, here, the circuit layer 14 is formed by suitable processes of selective deposition and/or selective etching. It should be understood that other methods of forming the circuit layer 14 may also be employed.

Next, the method includes punching and/or laser milling at least one aperture 17 alignable with at least one solder pad 15 of the plurality thereof in the LCP solder mask 16, which has a thickness of less than 0.0015 inch (Block 56'). The LCP solder mask 16 and LCP substrate 12 are then aligned and laminated together via the application of heat and pressure in an autoclave (Block 58'). An autoclave advantageously provides isostatic pressure (i.e. equal pressure from all directions), and helps to keep the LCP from deforming during the lamination process. While the use of an autoclave for lamination is preferred, a press (possible in an inert atmosphere) may also be used to perform the lamination.

Solder paste 20 is positioned in the apertures 17 by use of a solder stencil (Block 60'). The integrated circuit 22 is then attached to the solder pads 15 by heating the solder paste 20, which then melts and re-solidifies (Block 62'). Block 64' indicates the end of the method.

Figure 2A:
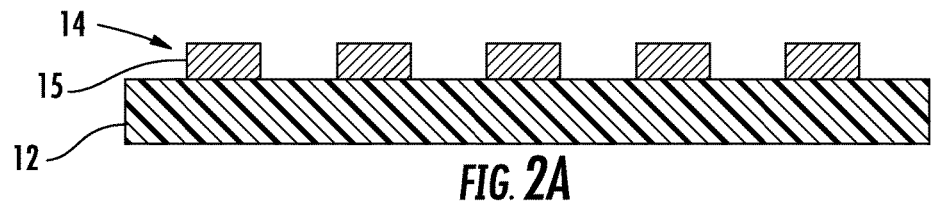
FIG. 2A-2F are sequential schematic cross sectional views of an electronic device of the present invention.
Figure 2B:
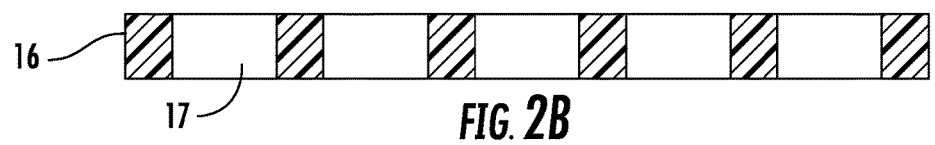
Figure 2C:
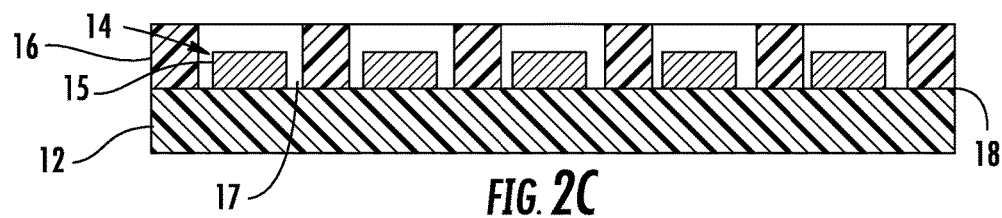
Figure 2D:
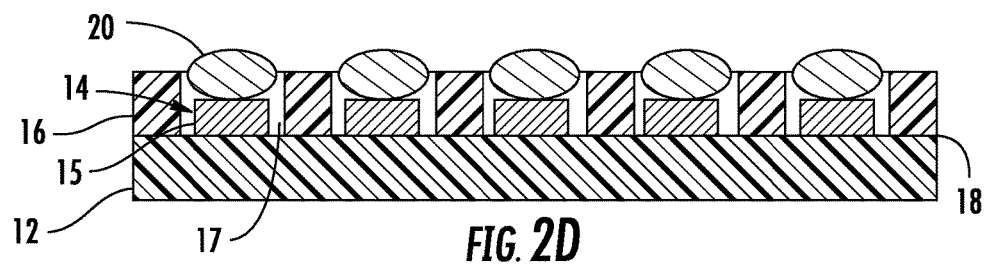
Figure 2E:
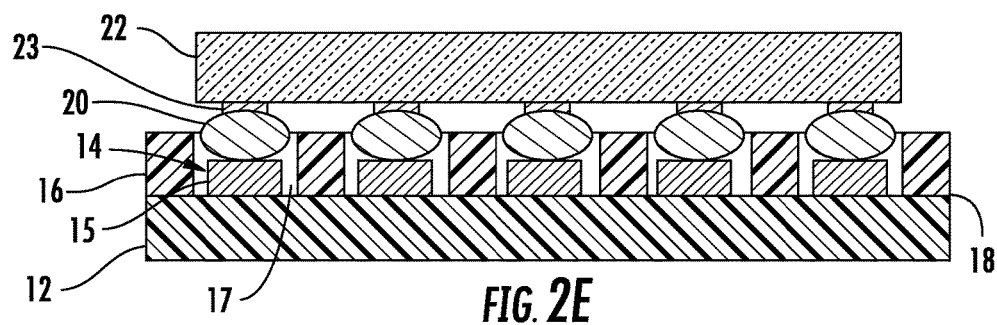
Figure 2F:
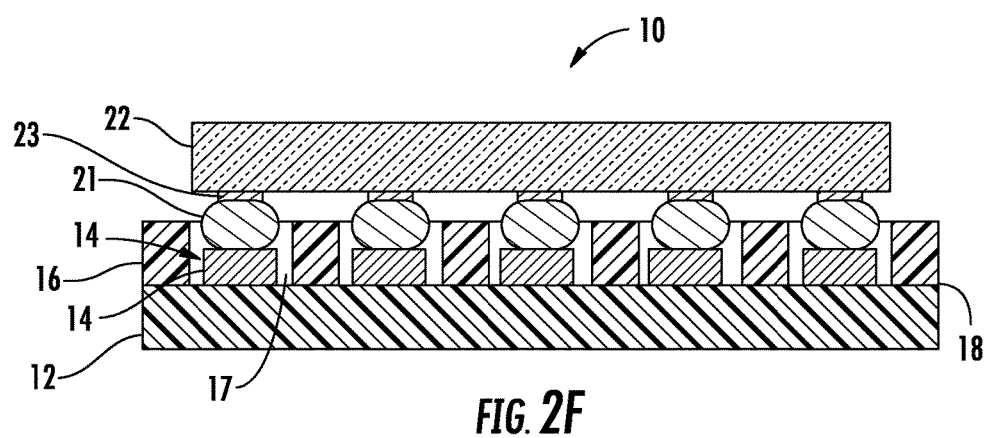
Figure 3:
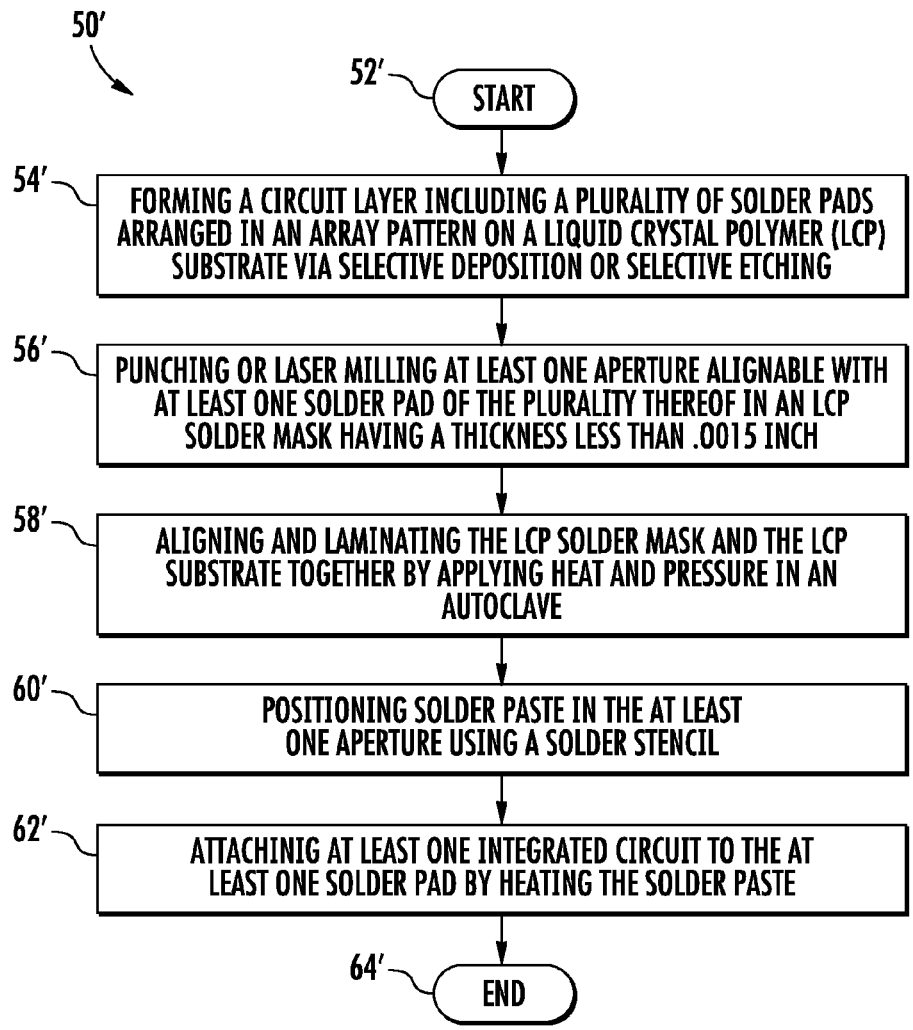
FIG. 3 is a flowchart of a more detailed method of making an electronic device according to the present invention.

The completed electronic device 10 is shown in FIG. 2F. The electronic device 10 comprises the LCP substrate 12, with a circuit layer 14 on the LCP substrate that includes at least one solder pad 15. The LCP solder mask 16 is on the LCP substrate 12, and the solder mask has at least one aperture 17 aligned with the at least one solder pad 15. There is a fused seam 18 between the LCP solder mask 16 and the LCP substrate 12. This fused seam 18 is formed during the melting and joining of the LCP solder mask 16 and the LCP substrate 12, and is readily visible in a photograph of a cross sectioned device.

An electrically conductive material 21 (illustratively melted solder) is in the apertures 17. An integrated circuit 22 is electrically coupled to the solder pads 15 via the electrically conductive material 21.

Other details of methods for making an electronic device 10 may be found in co-pending applications METHOD OF TRANSFERRING AND ELECTRICALLY JOINING A HIGH DENSITY MULTILEVEL THIN FILM TO A CIRCUITIZED AND FLEXIBLE ORGANIC SUBSTRATE AND ASSOCIATED DEVICES, U.S. Pat. No. 8,867,219, issued Oct. 21, 2014, and METHOD OF MAKING AN ELECTRONIC DEVICE HAVING A LIQUID CRYSTAL POLYMER SOLDER MASK LAMINATED TO AN INTERCONNECT LAYER STACK AND RELATED DEVICES, U.S. Pat. No. 8,693,203, issued Apr. 8, 2014, and ELECTRONIC DEVICE HAVING LIQUID CRYSTAL POLYMER SOLDER MASK AND OUTER SEALING LAYERS, AND ASSOCIATED METHODS, U.S. Pat. No. 8,472,207, issued Jun. 25, 2013, the entire disclosures of which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    a liquid crystal polymer (LCP) substrate;
    a circuit layer on said LCP substrate and comprising at least one solder pad;
    an LCP solder mask on said LCP substrate and having at least one aperture aligned with said at least one solder pad, said at least one aperture having a diameter of not greater than 0.002 inches, with the alignment having a positional accuracy of at least 0.001 inches;

said circuit layer being within said at least one aperture and being spaced apart from said LCP solder mask;

a fused seam between said LCP substrate and said LCP solder mask;

solder in the at least one aperture; and at least one circuit component comprising at least one pin extending to and contacting said solder in the at least one aperture.

2. The electronic device of claim 1, wherein said at least one solder pad comprises a plurality thereof arranged in an array pattern.

3. The electronic device of claim 1, wherein said at least one circuit component comprises at least one integrated circuit.

4. The electronic device of claim 1, wherein said LCP solder mask has a thickness of less than 0.0015 inches.

5. The electronic device of claim 1, wherein said LCP substrate and said LCP solder mask are matched to have a same dielectric constant and loss tangent based on an operating frequency of the at least one circuit component.

6. An electronic device comprising:

a liquid crystal polymer (LCP) substrate;

a circuit layer on an outermost upper surface of said LCP substrate and comprising an array of solder pads;

an LCP solder mask on said LCP substrate and having an array of apertures therein aligned with respective solder pads of said array of solder pads, each aperture having a diameter not greater than 0.002 inches and with the alignment having a positional accuracy of at least 0.001 inches so that each solder pad is positioned within a respective aperture;

said circuit layer being within said array of apertures and being spaced apart from said LCP solder mask;

a fused seam between said LCP substrate and said LCP solder mask;

solder in each aperture of the array of apertures;

at least one radio frequency (RF) circuit component comprising a respective pin extending to and contacting said solder in each aperture; and said LCP substrate and said LCP solder mask being matched to have a same dielectric constant and loss tangent based on an operating frequency of the at least one RF circuit component.

7. The electronic device of claim 6, wherein said at least one RF circuit component comprises at least one integrated circuit.

8. The electronic device of claim 6, wherein said LCP solder mask has a thickness of less than 0.0015 inches.

\* \* \* \* \*